(12) United States Patent
Ortiz et al.

(10) Patent No.: US 6,396,083 B1
(45) Date of Patent: May 28, 2002

(54) OPTICAL SEMICONDUCTOR DEVICE WITH RESONANT CAVITY TUNABLE IN WAVELENGTH, APPLICATION TO MODULATION OF LIGHT INTENSITY

(75) Inventors: Valentin Ortiz, Paris; Nikolaos Pelekanos, Grenoble, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/603,897

(22) Filed: Jun. 26, 2000

(30) Foreign Application Priority Data

Jul. 7, 1999 (FR) .............................. 99 08783

(51) Int. Cl.[7] .............................................. H01L 33/00
(52) U.S. Cl. .............................. 257/94; 257/95; 257/96
(58) Field of Search ............................ 257/94, 95, 96, 257/99; 372/43, 44, 45, 46, 70, 97, 98, 99

(56) References Cited

U.S. PATENT DOCUMENTS

| | | | | |
|---|---|---|---|---|
| 4,092,659 A | * | 5/1978 | Ettenberg | 347/49 |
| 4,317,086 A | * | 2/1982 | Scifres et al. | 372/49 |
| 5,425,042 A | | 6/1995 | Nido et al. | |
| 5,502,316 A | * | 3/1996 | Kish et al. | 257/94 |
| 5,793,054 A | * | 8/1998 | Nido | 257/18 |
| 5,903,586 A | * | 5/1999 | Ramdani et al. | 372/45 |

FOREIGN PATENT DOCUMENTS

| | | |
|---|---|---|
| EP | 63066983 | 3/1988 |
| EP | 0681200 | 5/1994 |

OTHER PUBLICATIONS

J. Talghader, et al. "Thermal dependence of the refractive index of GaAs and AiAs measured using semiconductor multilayer optical cavities", *Appl. Phys. Lett.* 66(3), Jan. 16, 1995 *American Institute of Physics*, pp. 335–337.

M. C. Larson, et al. "Wide and continuous wavelength tuning in a vertical–cavity surface–emiting laser using a micromachined deformable–membrane mirror", *Appl. Phys. Lett.* 68(7),Feb. 12, 1996, *American Institute of Physics*, pp. 891–893.

N.K. Dutta, et al. "Tunable InGaAs/GaAs/InGaP laser" *Appl. Phys. Lett.* 70 (70) Mar. 10, 1997, *American Institute Physics*, pp. 1219–1220.

J. Nieznanski "External–Cavity Semiconductor Laser with 15mm Continuous Tuning Range" *Electronics Letters* Jul. 17th 1986 vol. 22 No. 15, pp. 795–796.

S. Murata, et al. "Frequency–tunable Semiconductor Lasers," *Optical and Quantum Electronics* 22 (1990) 1–15.

(List continued on next page.)

*Primary Examiner*—Nathan Flynn
*Assistant Examiner*—Leonardo Andujar
(74) *Attorney, Agent, or Firm*—Burns, Doane Swecker & Mathis LLP

(57) ABSTRACT

Optical semiconductor device with resonant cavity tunable in wavelength, application to modulation of light intensity.

This device comprises a resonant cavity (2) delimited by two mirrors (4, 6) and at least one super-lattice (14) that is placed in the cavity and is formed from piezoelectric semiconducting layers, and means (20) of injecting charge carriers into the super-lattice. The optical properties of this super-lattice can thus be modified and the wavelength of cavity resonance modes can be offset. The invention is particularly applicable to optical telecommunications.

14 Claims, 5 Drawing Sheets

OTHER PUBLICATIONS

Fabio Bernardini, et al. "Spontaneous polarization and piezoelectric constants of III–V nitrides" *Physical Review B*, vol. 56, No. 16, Oct. 15, 1997–II, 1997 *The American Physical Society*.

D.A.B. Miller, et al. "Electric field dependence of optical absorption near the band gap of quantum–well structures", *Physical Review B* vol. 32, No. 2, Jul. 15, 1985, 1985 The American Physical Society.

Ran–Hong Yan, et al. "Analysis and Design of Surface–Normal Fabry–Perot Electrooptic Modulators", *IEEE Journal of Quantum Electronics*, vol. 25, No. 11. Nov. 1989, pp. 2272–2280.

D.L. Smith, et al. "Theory of semiconductor superlattice electronic structure" *Reviews of Modern Phsics*, vol. 62, No. 1, Jan. 1990, *The American Physical Society*, pp. 173–234.

E. Anastassakis "Piezoelectric fields in strained heterostructures and superlattices" *Physical Review B* vol. 46, No. 8, Aug. 15, 1992–II, *The Americal Physical Society*, pp. 4744–4747.

Gottfried H. Dohler, "Nonlinear optical properties of n–i–p–i and hetero n–ip–i structures and their potential for application in photonics", *Optical and Quantum Electronics* 22 (1990) S121–S140, 1990 Chapman and Hall Ltd.

P. Michler, et al. "Quantum confined Stark effect of III–VI heterostructures suitable as modulators in the blue–green spectral region", Applied Physics Letters, vol. 72, No. 25. Jun. 22, 1998, 1998 American Institute of Physics. pp. 3320–3322.

Guido Mula, et al. "Room temperature electro–optic effect in CdHgTe multiple quantum well heterostructures at 1.5 $\mu m$", *Appl. Phys. Lett.* 70(7), Feb. 17, 1997, *American Institute of Physics*, pp. 856–858.

Dubravko I. Babc, et al. "Room–Temperature Continuous–Wave Operation of 1.54–$\mu m$ Vertical–Cavity Lasers" *IEEE Photonics Technology Letters*, vol. 7. No. 11, Nov. 1995, pp. 1225–1227.

Jacques I. Pankove, "Optical Processes in Semiconductors" International Standard Book No.: 0–486–60275–3, Library of Congress Catalog Card No.: 75–16756, 1971 Prentice–Hall, Inc.

Kwang Joo Kim, et al. "Optical constants and electronic interband transitions of disordered $GaAs_{1-x}P_x$ alloys", *Journal of Applied Physics*, vol. 84, No. 7, Oct. 1, 1998, *1998 American Institute of Physics*. pp. 3696–3699.

Sajal Paul, et al. Empirical expressions for the alloy composition and temperature dependence of the band gap and intrinsic carrier density in $Ga_xIn_{1-x}As$, 1991 American Institute of Physics. pp. 827–829.

C. Alibert, et al. "Electroreflectance and Band Structure of $Ga_xIn_{1-x}P$ Alloys", *Physical Review B*, vol. 6, No. 4, Aug. 15, 1972.

P. Desjardins, et al. "Structural and optical properties of strain–relaxed inAsP/InP heterostructures grown by metalorganic vapor phase epitaxy on InP(001) using tertiarybutylarsine"*J. Appl. Phys.* 80 (2) Jul. 15, 1996 *American Institute of Physics*, pp. 846–852.

K.W.Goossen, et al. "Observation of room–temperature blue shift and bistability in a strained GaAs–GaAs (111) self–electro–optic effect device" Appl. Phys. Lett. 56 (8) Feb. 19, 1990, 1990 American Institute of Physics, pp. 715–717.

V. Ortiz, et al. "Tunable semiconductor laser device based on piezoelectric heterostructures," CLEO'99, XP–000901212.

U.S. Patent Application Serial No. 09/397,106 filed on Sep. 16, 1999 For "Semiconductor Laser with Tunable Gain Spectrum".

* cited by examiner

OPTICAL SEMICONDUCTOR DEVICE WITH RESONANT CAVITY TUNABLE IN WAVELENGTH, APPLICATION TO MODULATION OF LIGHT INTENSITY

TECHNICAL FIELD

This invention relates to an optical semiconductor device with resonant cavity tunable in wavelength.

This device may equally well be made in the form of a coherent light source, for example a vertical emission laser also called VCSEL in the rest of this document, or an edge emission laser, or in the form of an incoherent light source, for example a light emitting diode also called LED throughout the rest of this document and with vertical emission or edge emission.

The device according to the invention may also be made in the form of an optical modulator operating in reflection or in transmission.

The invention is used in a variety of fields, for example such as optical telecommunications, all optical networks, information display and spectroscopy.

STATE OF PRIOR ART

Note that in a vertical emission diode, the mirrors that delimit the resonant cavity of the diode are formed perpendicular to the growth axis of the layers surrounding the active area and the spacer located in the cavity. This spacer is itself between the active area and the cavity mirrors.

The length of this cavity may be of the order of 1 $\mu$m and it is then called a "micro-cavity". A single optical mode is usually selected in this type of micro-cavity due to the thinness of the micro-cavity, although there may be several optical modes in a thicker resonant cavity.

Vertical emission diodes of the VCSEL or LED type offer enormous potential for the optical telecommunications market due to:

- their ease of manufacturing, so that matrices can be made with a large number of light emitters,
- the quality of the electromagnetic mode of their light emission, and
- their ease of integration into optoelectronic circuits.

Vertical emission laser diodes that are tunable by temperature variation are already known in document [1] which, like the other documents mentioned below, is included in the references at the end of this description. This type of diode has a very long response time, of the order of 1 second, and a narrow tunability range.

Document [2] also describes a vertical emission diode tunable using a deformable membrane that is electrically controlled and forms the output mirror from the resonant cavity of the diode, which may have a tunability of several tens of nanometers. However, it is difficult to make and consequently is fairly expensive. Furthermore, the use of a deformable membrane gives a fairly long response time, of the order of 1 $\mu$s.

Document [3] describes laser diodes tunable by temperature variation, for edge emission diodes. This type of diode has a very long response time, of the order of 1 second, and a fairly limited tunability range.

Document [4] also describes edge emission laser diodes that are tunable by means of an external diffraction grating. The response time of this type of diode is of the order of 1 millisecond and they are also large and very expensive.

Furthermore, document [5], to which we will refer, describes tunable edge emission laser diodes in which the resonant cavity comprises an active region, a region with a variable refraction index (phase shifter) and a region forming a distributed Bragg reflector (DBR), these regions being included monolithically on a substrate.

When a current passes through the active region, a stimulated emission effect is obtained with a gain spectrum over a fairly wide range. A large number of cavity nodes is available within this range. Nevertheless, since the DBR has a single maximum at wavelength $\lambda_f$, only one cavity mode can actually lead to laser radiation. In this configuration, tunability is obtained by allowing a current to pass through the DBR, which changes the refraction index in this DBR by a plasma effect and therefore offsets $\lambda_f$, in other words the emission wavelength.

Despite this offset, cavity modes remain practically unchanged and therefore the emission passes discontinuously from one mode to the other. The region with a variable refraction index is used to prevent this effect, and is controlled by an electrical current independently of the DBR. This change in the refraction index is sufficient to offset cavity modes that can then follow the variation of $\lambda_f$. This can give a continuous variation of the emission wavelength.

The response time of this type of diode is directly related to the lives of charge carriers in the region with variable refraction index, and in the region of the DBR, and is equal to about 1 nanosecond.

However, these diodes are difficult to make and therefore expensive and also require complex electronic means to control the laser radiation wavelength since three electrical currents are necessary for this purpose (one current for each of the regions mentioned above).

DISCLOSURE OF THE INVENTION

The purpose of this invention is to correct the disadvantages mentioned above by proposing an optical semiconductor device with resonant cavity tunable in wavelength which is easier to make and therefore less expensive than the devices described in documents [2] and [5], but is still fast, this device being likely to have a response time, in other words a wavelength switching time, of the order of 1 nanosecond or even less.

More precisely, the purpose of this invention is an optical semiconductor device with a resonant cavity tunable in wavelength, this device comprising a resonant cavity and two mirrors that delimit this cavity, this device being characterized in that it also comprises:

at least one super-lattice that is placed in the cavity and is formed starting from piezoelectric semiconducting layers, and first means of injecting charge carriers into the super-lattice, so that the optical properties of this super-lattice can be modified when the charge carriers are injected into it thus creating an offset in the wavelength of the cavity resonance modes.

In this document, the "piezoelectric" effect should be understood in the broad sense and thus also includes phenomena in which an electric field appears in a strained semiconducting layer, and spontaneous polarization phenomena in semiconducting layers of the wurzite type in which an electric field can occur without any strain being applied to these layers. Further information on this subject can be found in document [6].

The device may also comprise an active area placed in the cavity and designed to emit coherent radiation during the injection of charge carriers into this active area.

This radiation emission may equally well be coherent emission (laser) or incoherent emission.

According to a first particular embodiment of the device according to the invention, the first charge carrier injection means are also designed to inject these charge carriers into the active area so that this active area emits radiation.

According to a second particular embodiment, the device also comprises second charge carrier injection means designed to inject these charge carriers into the active area so that this active area emits radiation.

These charge carriers are then independent of carriers that are injected into the super-lattice that is formed starting from piezoelectric semiconducting layers and subsequently denoted SR-P.

In a first example, the device according to the invention may emit laser radiation, the mirrors being perpendicular to the growth axis of the semiconducting layers included in the device, in order to obtain vertical emission of the laser radiation.

In a second example, the device according to the invention may emit incoherent radiation, the mirrors being perpendicular to the growth axis of the semiconducting layers included in the device in order to obtain vertical emission of incoherent radiation.

In a third example, the device according to the invention can emit laser radiation, the mirrors being parallel to the growth axis of the semiconducting layers included in the device, in order to obtain edge emission of the laser radiation.

In a fourth example, the device according to the invention may emit incoherent radiation, the mirrors being parallel to the growth axis of the semiconducting layers included in this device, in order to obtain edge emission of the incoherent radiation.

The first, third and fourth examples above are applicable in particular to optical telecommunications, whereas the second example is applicable in particular to information display and spectroscopy (detection of gases or pollutants).

The first means of injecting charge carriers may be electrical.

As a variant, these first injection means may be optical.

Piezoelectric semiconducting layers may have zinc blende type crystalline structures.

As a variant, these piezoelectric semiconducting layers may have wurtzite type crystalline structures.

In a particular embodiment of the device according to the invention, this device does not include an active layer in its resonant cavity and forms an optical modulator that operates in reflection or in transmission and is capable of modulating incident light using the variation of cavity modes. The conducting or non-conducting state of the modulator depends on the position of these modes. This modulator is used particularly for optical telecommunications and all-optical network applications.

The modulation rate of a device according to the invention may be greater than 1 GHz for a tunability of the order of a few nanometers.

The invention also relates to a light intensity modulation device comprising an optical device according to the invention that comprises an active area placed in the resonant cavity of this optical device, this optical device being optically coupled to another resonant cavity without an active area but in which a super-lattice is placed formed from piezoelectric semiconducting layers, this other cavity being capable of resonating at one or more tunable wavelengths.

The invention also relates to a light intensity modulation device comprising an optical device according to the invention that includes an active area placed in the resonant cavity of this optical device, which is optically coupled to another resonant cavity without an active area or super-lattice formed from piezoelectric semiconducting layers, this other cavity being capable of resonating at one or a plurality of fixed wavelengths.

BRIEF DESCRIPTION OF THE DRAWINGS

This invention will be better understood after reading the following embodiment examples, which are given for information only and are in no way restrictive, with reference to the drawings in the appendix in which.

DETAILED DISCLOSURE OF PARTICULAR EMBODIMENTS

We will now compare the invention with known devices described in document [2].

A vertical emission device of the VCSEL or LED type according to the invention is distinguished from known diodes described in document [2] in that its manufacturing process is much simpler and its switching speed is much higher due to its radically different operating principle.

Furthermore, this type of device according to the invention can be made using a single control current which very much simplifies the integration of this device into optoelectronic systems.

The tunability of this type of device is about 10 nm and its response time is equal to about 1 nanosecond.

Figure 1:
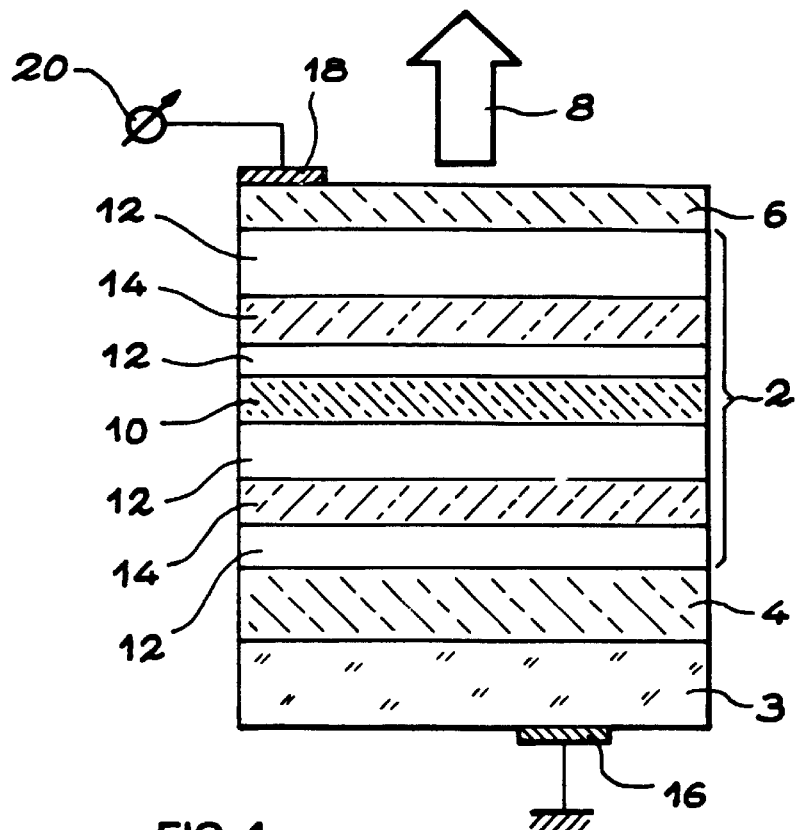
FIG. 1 diagrammatically illustrates a first particular embodiment of the device according to the invention, with vertical emission, FIG. 2 diagrammatically illustrates a second particular embodiment of the device according to the invention, with edge emission.

FIG. 1 diagrammatically shows a vertical emission semiconductor device emitting light according to the invention. This device comprises a resonant micro-cavity 2 formed on an N type semiconducting substrate 3 and delimited by a lower mirror 4 made of an N type semiconducting material in contact with the substrate, and an upper mirror 6 made of a P type semiconducting material through which the radiation 8 generated in the device is emitted. Obviously, other doping combinations would be possible, for example by inverting the N and P type areas.

The micro-cavity contains an active area 10 (medium with positive gain) comprising one or a plurality of quantum wells, and a spacer 12 made of a semiconducting material on each side of this area.

Furthermore, one or a plurality of super-lattices made of a piezoelectric semiconducting material, called SR-P in the rest of this description, are included in the spacer, for example between the active area 10 and the mirror 4 and/or between this area 10 and the mirror 6.

The active area 10 is not necessarily at the center of the micro-cavity, but is preferably placed at a minimum in the stationary electromagnetic field established in the resonant micro-cavity 10. Instead of this, the active area could be distributed at several locations in the micro-cavity and placed on several minima in the electromagnetic field.

FIG. 1 also shows an earthed electrode 16 in contact with the substrate 3 and another electrode 18 in contact with the upper mirror 6 and connected to a variable negative voltage source 20. This is used to directly (and variably) polarize the diode formed by the device in FIG. 1 and to inject charge carriers into the SR-P(s).

Operation of this device that is tunable in wavelength is based on the use of electro-optical semiconductor effects, for example the Franz Keldysh effect or the quantum confined Stark effect. Document [7] contains further information on this subject.

Each SR-P 14 is designed such that the presence of load carriers in the device modifies its optical properties (absorption coefficient, but especially the refraction index). In this case, when carriers are injected into micro-cavity 2 to obtain light emission, they are distributed at the same time in active area 10 and the SR-P by inducing a modification in the refraction index.

If the micro-cavity resonance is within this refraction index variation range, the micro-cavity is affected and the resonance wavelength is offset.

Since the SR-P is such that carriers injected into it can also be used for light emission in the active area 10, the injection of carriers may induce firstly a stimulated emission and secondly continuous variation of the emission wavelength. Consequently, it is possible to use a single control current.

But it would also be possible to use a control current for light emission and optical injection of carriers to modify the optical index of the SR-P(s). Conversely, it would be possible to use optical injection of carriers for light emission and electrical control to modify the index of the SR-P(s).

If laser light emission is used, a VCSEL tunable in wavelength is obtained. If spontaneous emission is used, a light emitting diode (LED) tunable in wavelength is obtained.

We will now compare the invention with known devices described in document [5].

Figure 2:
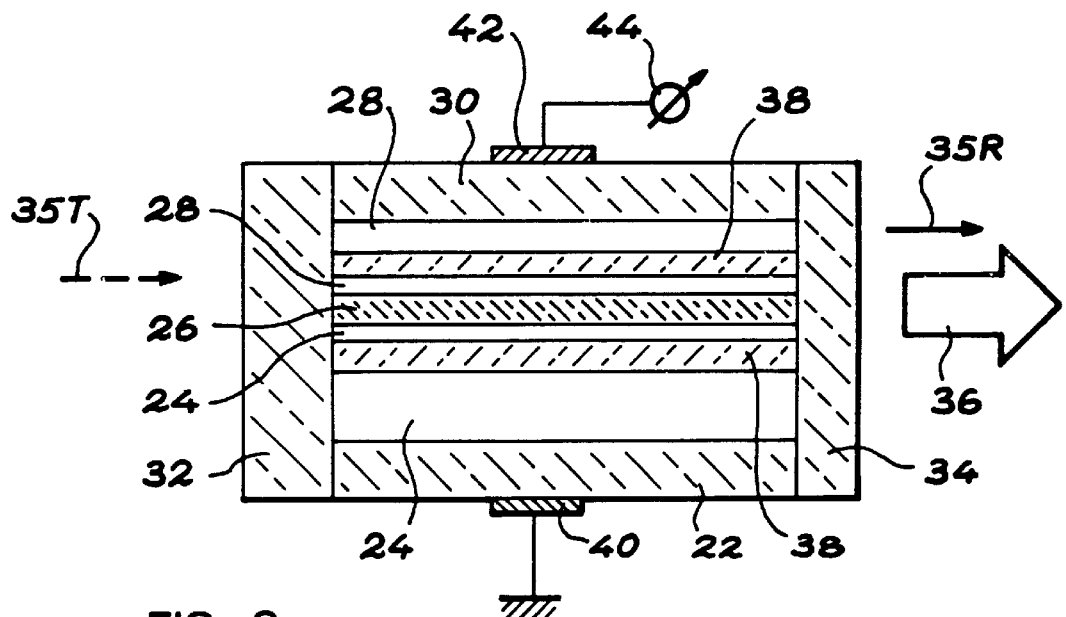

A semiconductor device emitting light according to the invention with edge emission is diagrammatically shown in FIG. 2. This device comprises a semiconducting stack comprising in sequence an N type semiconducting substrate 22, a first barrier layer 24, an active layer 26, a second barrier layer 28 and a P type semiconducting layer 30.

Mirrors 32 and 34 are formed at two ends of this stack respectively, parallel to the growth axis of the stack, and delimiting the resonant cavity of the device. The mirror 32 is capable of reflecting light generated in the active layer, while mirror 34 is partially transparent to allow a certain amount 36 of this light to pass.

The stack also comprises at least one SR-P reference 38 in the barrier layer 24 and/or in the barrier layer 28. An electrode 40 is formed on the substrate 22 and is grounded, and another electrode 42 is formed on the layer 30 and is connected to a negative variable voltage source 44 capable of polarizing the diode directly (and variably) making up the device in FIG. 2 and injecting charge carriers into the resonant cavity of this device.

These charge carriers are thus injected into the active layer 26 that generates light emission, and also into the SR-P(s). These charge carriers therefore change the optical index of the SR-P(s), which changes the position of the modes of the resonant cavity.

Figure 3:
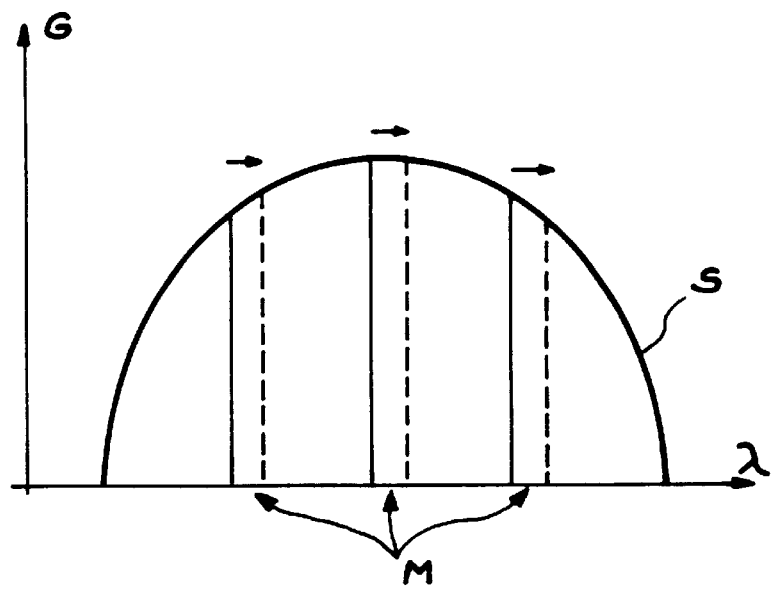
FIG. 3 shows a gain spectrum for a laser diode according to the invention, with edge emission.

This is diagrammatically illustrated in FIG. 3 in which $\lambda$, M, G and S represent the wavelength of emitted light, cavity modes, the gain and the gain spectrum respectively. If the gain spectrum of the active part is located in an area in which the variation of the wavelength of cavity modes is significant, then the wavelength of emission modes can be controlled continuously, and light can be emitted at the same time.

In conclusion when carriers are injected, firstly light is emitted, and secondly emission modes are offset.

But it is also possible to use a control current for light emission and an optical injection of carriers to modify the optical index of the SR-P(s). Conversely, optical injection of carriers can be used for light emission and an electrical control may be used to modify the index of the SR-P(s).

The response time of the device in FIG. 2 is equal to about 1 ns and its tunability range is a few nanometers.

This tunable device in FIG. 2 may be used either independently or as an element in a monolithically integrated three-stage laser, like the tunable laser in document [5]. This device may replace the first two stages of this tunable device, in other words the active region and the area with a variable refraction index, the role of which is to offset the wavelength of cavity modes, as mentioned above.

In general, the SR-P may be included in any of the stages of the laser in document [5] in order to improve its performances.

This invention can also be used to make Fabry-Perot electro-optical or all-optical modulators. In this case, the variation of resonance is used to modulate an optical signal in reflection or in transmission, and not to vary the wavelength of an emission (there is no active area) in these modulators.

Electro-optic modulators are extremely important for optical telecommunication networks, since the reception of multiplexed signals requires good wavelength selectivity. All-optical modulators are used for making optical memories or all-optical circuits.

A modulator conform with the invention is an alternative to the device described in document [8]. This modulator is identical to the device in FIGS. 1 and 2 but does not contain an active area.

Furthermore, for operation in transmission, the incident light to be modulated (reference 35T in FIG. 2) is directed towards mirror 32 which must be partially transparent to this light, reference 36 then corresponds to the modulated light, whereas for operation in reflection, the light 35R to be modulated is sent to mirror 34 and mirror 32 may remain a simple reflector. This operation may also be applied to the device in FIG. 1.

Injection of carriers in the modulator cavity induces simply an offset in resonance. The variation in resonance is used to define the "conducting" state and "non-conducting" state of the modulator.

Therefore, the modulation is induced by electrical or optical injection of carriers. In particular, this means that the same component can be used in direct polarization and in optical pumping.

The response time of modulators according to the invention may be lowered to a fraction of a nanosecond.

Admittedly, devices are known in which the optical index of a layer may be varied and can be used to vary the modes of a cavity. But none of these devices can be used to envisage light emission at the same time as controlling the wavelength of the modes.

For example, document [8] describes a micro-cavity containing a layer for which the optical index is varied by applying an electric field to this layer. However, this cannot be used to make light emitting diodes with a tunable wavelength according to the invention, since, in addition to the application of an electric field in order to vary the resonance(s), these diodes also require the injection of charge carriers to obtain the laser effect. This is not possible with the known micro-cavity described in document [8], considering that the injection of charge carriers would clip the applied electric field and would thus prevent tunability.

Devices called "nipis" are also known, but in these devices, it is impossible to create a variation of the optical index and a light emission effect at the same time, for the same injected power density. Therefore, "nipi" type structures cannot be used to make light emitters with variable wavelengths as will be described better in the following. Furthermore, their field of application is limited essentially to light modulation.

We will describe the operating principle of the invention in more detail.

This invention is based on use of the piezoelectric effect. For semiconductors with a zinc blende type crystallographic structure, the piezoelectric layers are strained layers obtained by epitaxial growth on substrates with high crystallographic indexes <n,l,m>, with n×l×m≠0, for example <111> or <211>

Document [9] describes that a biaxial strain in the plane of the type of layer generates an electric field along the layer growth axis.

The piezoelectric fields in semiconductors can easily exceed 100 kV/cm for moderate mismatch values in the mesh parameters (see document [10]).

The structure proposed in this invention is made on a substrate, for example a semiconducting substrate, and in a preferred embodiment it is composed of alternating layers of two different types with the same prohibited band and in which there are piezoelectrically generated electric fields in opposite directions. The super-lattice made of a piezoelectric semiconducting material, or SR-P, thus obtained is included in a resonant cavity.

Figure 4:
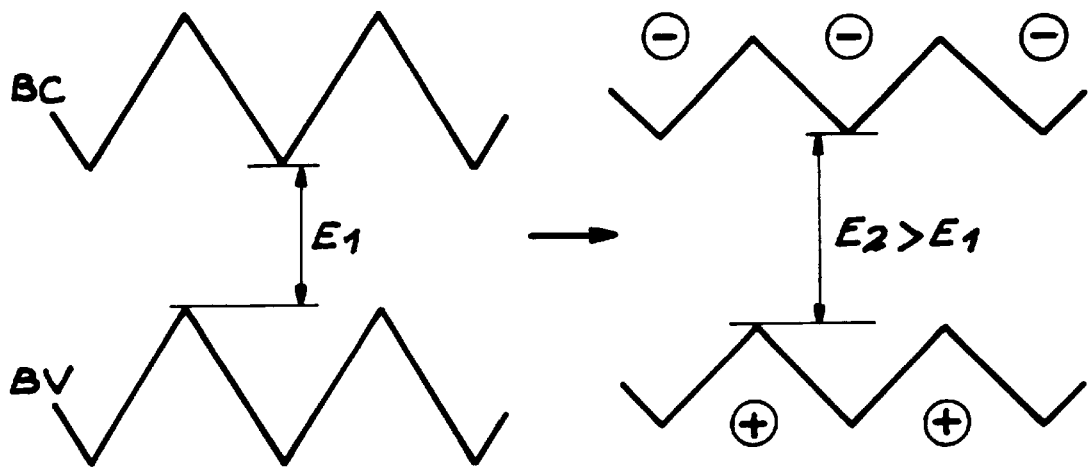
FIG. 4 shows the variation of a band diagram for a portion of a piezoelectric super-lattice when charge carriers are injected into it.

FIG. 4 shows an example of this type of device. The valence band and the conducting band are denoted BV and BC respectively.

In FIG. 4, $E_1$ represents the difference between the minima of the bands and $E_2$ (which is greater than $E_1$) is the difference between the minima of the bands when carriers are injected.

When charge carriers are injected into the resonant cavity of the device, the alternate electric fields of the SR-P separate the electrons (−) and the holes (+) that accumulate at the interfaces of the two types of layers, with the electrons on one side and the holes on the other. The space charge field thus formed clips the piezoelectric fields present in the structure, which changes the absorption of the SR-P layers.

Figure 5:
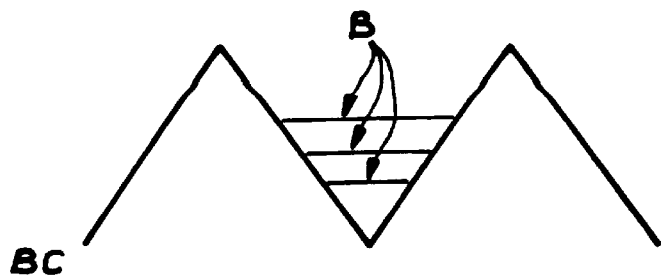
FIG. 5 is a band diagram showing quantum levels confined in a piezoelectric super-lattice.
Figure 5:
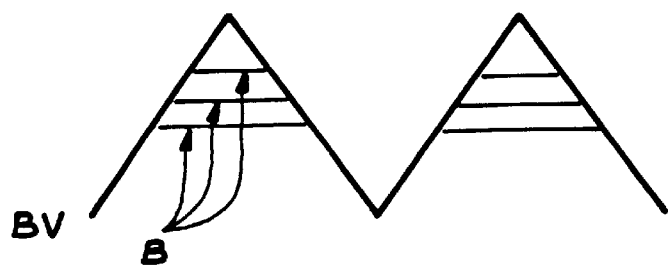

If the characteristics of the SR-P are such that there are confined quantum levels in the SR-P, then the absorption change is due to a variant of the confined quantum Stark effect (see FIG. 5 in which the B lines symbolize confined energy levels of the SR-P) with the specific feature of being type II transitions (indirect in space).

On the other hand, if the characteristics of the SR-P are such that there are no confined levels in the SR-P, the absorption change is due instead to a variant of the Franz-Keldysh effect.

In both cases, the variation of the absorption coefficient results in a variation of the refraction index of the cavity.

If the cavity is a micro-cavity, there is usually only one resonance mode. In order to be able to control the wavelength of this mode, it is essential that it should be in a range in which the index variation caused by the injection of carriers is important.

If the cavity is not a micro-cavity and if there is a large number of modes, all modes present in the optical index variation range are offset.

The variation of the position of a resonance is related to the variation of the index by the following relation, assuming a perfect resonant cavity:

$$\Delta n/n = \Delta \lambda/\lambda$$

where n is the average refraction index of the cavity and λ is the resonance wavelength.

In a real cavity, it is necessary to allow for penetration of the electromagnetic field in the mirrors that delimit the cavity and the variation of the optical index with the wavelength. Thus in the case of a micro-cavity, the variation of the wavelength may be about 60% of the ideal value (see document [8]). For a cavity formed with cleaved surfaces, it is close to 90%.

Thus a variation of 1% of the optical index can give a tunability of 8 nm on a mode for a micro-cavity at 1.5 μm. Remember that the variation Δn of the optical index is related to the variation Δα of the absorption by the Kramers-Kronig relation.

A study of the Franz-Keldysh effect in massive materials and the confined quantum Stark effect (see documents [11], [12], and [13]) in multi-quantum wells, demonstrate the possibility of varying the optical index at ambient temperature of up to 1% for fields of 100 kV/cm.

Using a simple plane capacitor model, the order of magnitude of the charge density necessary to obtain fields of the order of 100 kV/cm inside the SR-P can be estimated to be $6 \times 10^{11}$ cm$^{-2}$. This is easily achievable using the available excitation densities.

Therefore, carrier injection is a means of continuously controlling the resonance wavelength of the micro-cavity.

Furthermore, it is obvious that for two applications of the invention with stimulated emission, it is impossible to locate the emission wavelength and therefore the resonance wavelength on the area of the maximum optical index variation which is usually an area with high absorption; the cavity resonance has to be placed at the absorption "tail". This reduces the variation range of the optical index, and therefore the tunability range.

In order to obtain a tunable light emitter, it is necessary that the laser effect and the tunability effect operate for the same injected carrier densities. Firstly, the laser effect in the semiconductors is obtained for current densities of the order of 1 kA/cm$^2$. Secondly the carrier density necessary for charging the SR-P is of the order of 6×10$^{11}$ charges per cm$^2$. In order to satisfy these two conditions, the life of carriers in the SR-P must be of the order of a hundred picoseconds which is not possible for "nipi" type structures, but is possible with SR-Ps.

The "rise" time of the device (in other word the time necessary to "charge" the structure) is equal to disexcitation time of the carriers to the bottom of the bands. This time is of the order of ten picoseconds since the disexcitation processes are essentially non-radiating and are governed by interactions with phonons. Therefore, it can be said that the rise time is practically zero.

Figure 6:
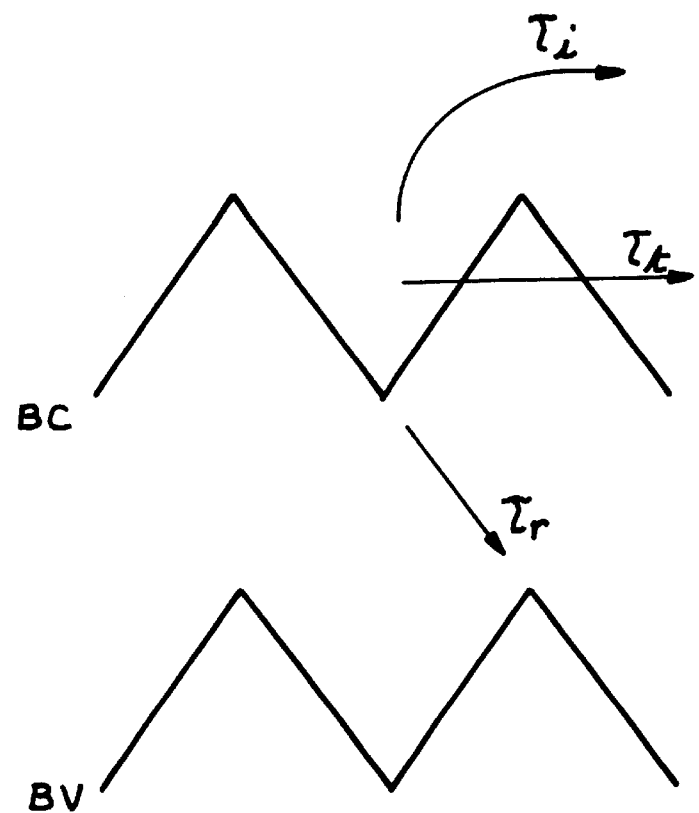
FIG. 6 is a band diagram symbolically showing a piezoelectric super-lattice on which different times are used to estimate the response time of the device according to the invention.

The fall time, in other words the time that the structure takes to discharge itself, is of the order of the life of the carriers in each "minimum" of the SR-P. This life $\tau$ is given by the following formula.

$$\frac{1}{\tau} = \frac{1}{\tau_r} + \frac{1}{\tau_i} + \frac{1}{\tau_t}$$

where $\tau_r$ is the radiation life of carriers in the "minima" of the SR-P, $\tau_t$ is the tunnel effect escape time through barriers surrounding the "minima", and $\tau_i$ is the thermionic escape time of carriers above the barriers (see FIG. 6).

Therefore, the life of the carriers depends very much on the structure; depending on its characteristics $\tau$ can vary for example between about a hundred picoseconds and 1 μs. The latter case may be envisaged if the electrons and holes are spatially very much separated by high barriers, which is normally the case if the period of the super lattice is high.

According to another variant of the invention, one or several quantum wells such as P1, P2, P3, P4 (FIG. 7) may be included in the SR-P. In this case, the injection of carriers into the cavity changes the absorption of wells, mainly due to the confined quantum Stark effect, which causes a change in the refraction index and therefore an offset in the wavelength of the cavity modes.

Figure 7:
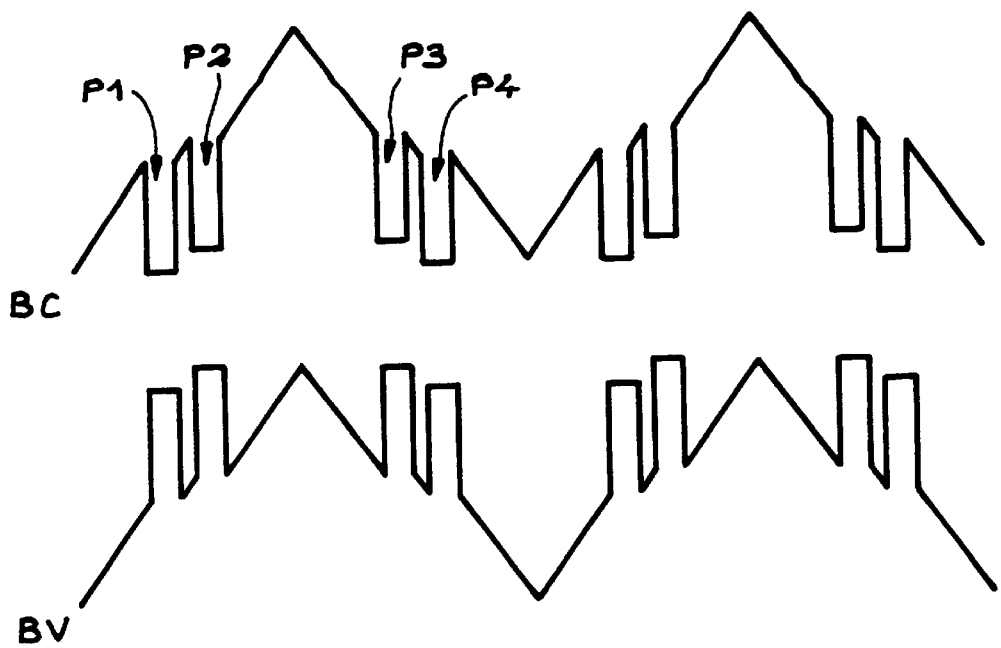
FIG. 7 is a band diagram corresponding to two periods of a piezoelectric super-lattice containing quantum wells.

In a more general case than that shown in FIG. 7, these quantum wells may also be placed in an electric field.

Figure 8:
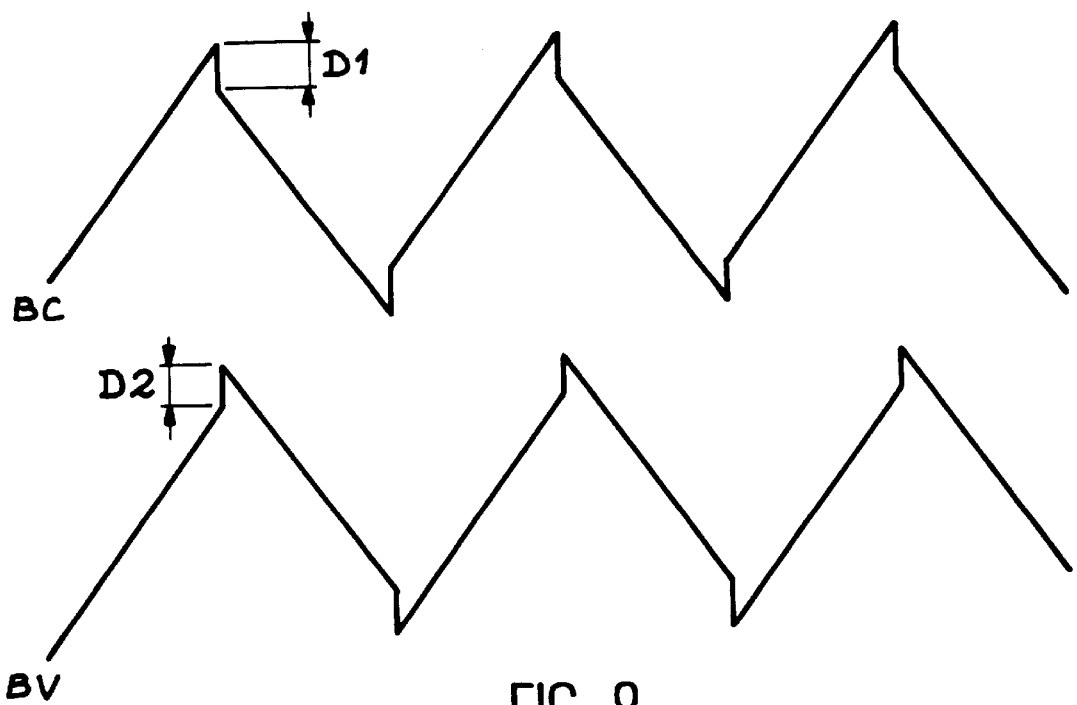
FIG. 8 is a band diagram corresponding to the three periods of a piezoelectric super-lattice with a different prohibited band for the two super-lattice materials.

Other variants may be considered: (a) for example, carrier collection wells may be placed in the SR-P or (b) the prohibited band may be different in the two component materials of the SR-P or (c) the two materials may have the same prohibited band but there may be a valence band offset not equal to zero (see FIG. 8 in which references D1 and D2 denote offsets of the conducting band and the valence band respectively).

The essential point is that during the injection of carriers, the electron-hole pairs are locally separated to be able to create space charge fields in the SR-P, in order to modify its absorption.

In another variant, if the difference between the prohibited band in the two materials is large and the period of the SR-P is short, the case is similar to the case of piezoelectric wells, in other words wells in which there is a field with a piezoelectric origin. When carriers are injected, they accumulate in the wells and clip the piezoelectric field, which changes absorption and therefore the refraction index of the layer.

We will now consider examples of the invention.

Figure 9:
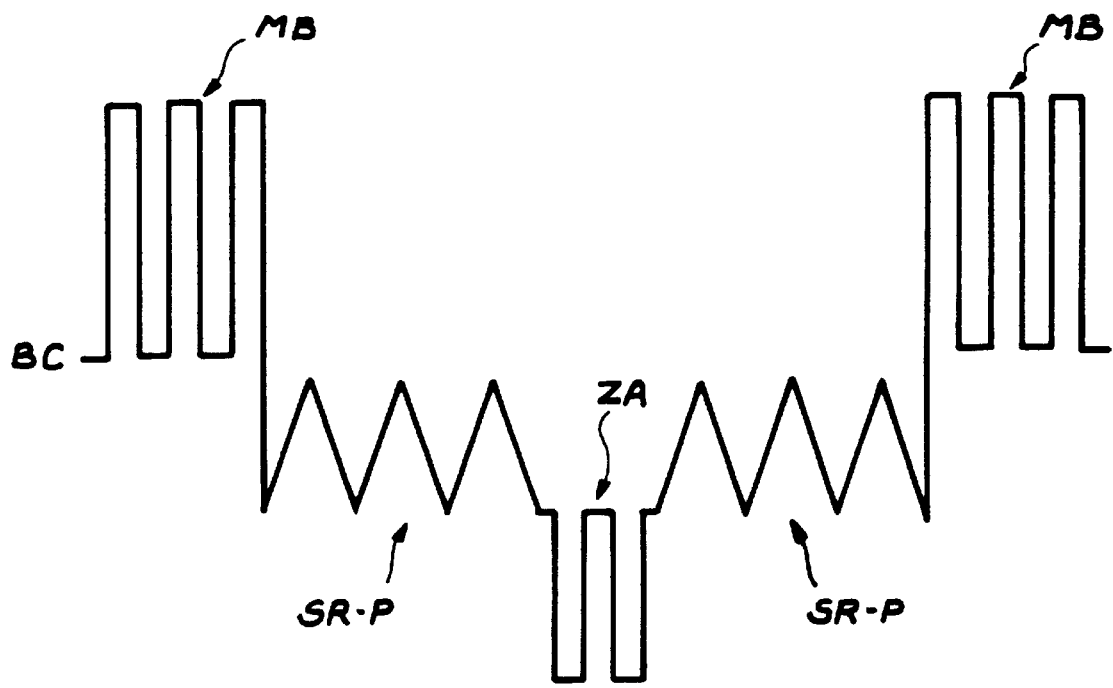
FIG. 9 is a conducting band diagram corresponding to an example of a vertical emission diode according to the invention, containing an active area formed of quantum wells and included in a piezoelectric super-lattice.

The first example is illustrated diagrammatically by FIG. 9 and relates to a vertical emission diode. The SR-P and an active area ZA composed of one or several quantum wells are placed between the two Bragg mirrors MB that delimit the resonant cavity of the diode, so that light is emitted when carriers are injected. These quantum wells form the fundamental state of the entire structure and are not necessarily located at the center of the micro-cavity, but may be placed in one or several "minima" in the electromagnetic field.

Furthermore, the quantum wells are such that the gain spectrum of the active area contains the wavelength for micro-cavity mode, which in turn is located in a range in which there is an index variation when carriers are injected.

Therefore, light emission may be obtained by varying the micro-cavity resonance mode. In the case of a laser emission, there is a VCSEL tunable in wavelength, and in the case of a spontaneous emission simply, there is a tunable light emitting diode (LED).

Quantum wells in the active area may be surrounded by thin, high barriers to increase confinement and prevent leakage of carriers inducing laser emission.

Figure 10:
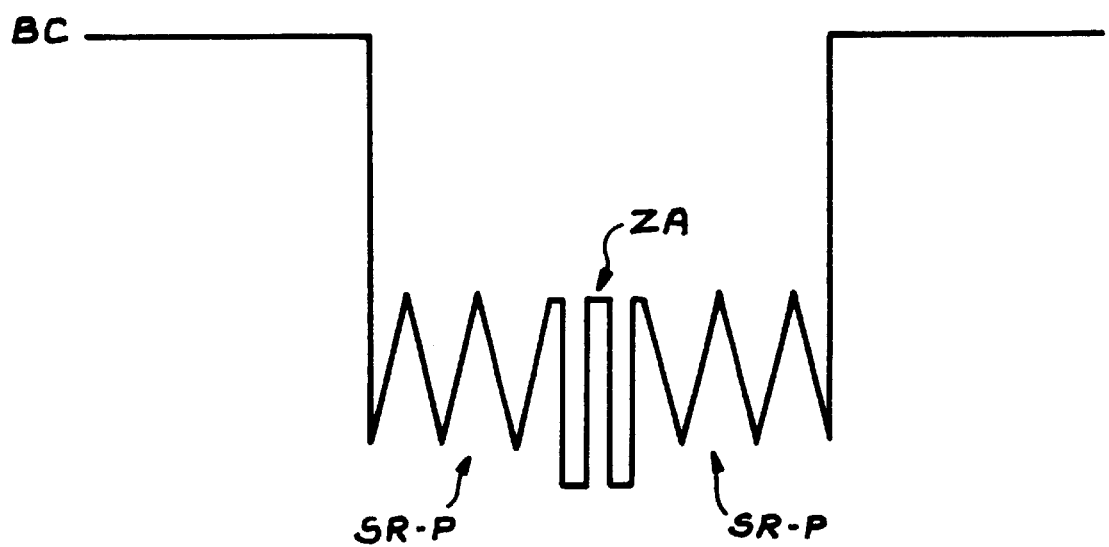
FIG. 10 is a conducting band diagram corresponding to the example of an edge emission diode according to the invention, containing an active area formed of quantum wells and a piezoelectric super-lattice included in an index confinement structure of the heterostructure type with separate confinement.

The second example is diagrammatically illustrated in FIG. 10 and relates to an edge emission diode. The active area ZA is included in an SCH type structure, in other words a separate confinement heterostructure in which the barriers surrounding the active area form an SR-P. The quantum wells of the active area form the fundamental state of the entire structure. The gain spectrum of the active area is located within a range in which the optical index variation is high when carriers are injected.

In this case, when carriers are injected, the diode emits on several modes included in the gain spectrum range, and at the same time the wavelength of these modes is offset as a function of the density of the injected carriers.

In a third example, the tunable carrier is used as a Fabry-Perot modulator. In this case, the spacer is composed of an SR-P and there is no active area. When carriers are injected, they induce a variation in the resonance of the cavity as described above.

Unlike light emitting diodes, the modulator is capable of operating regardless of the life of the carriers in the SR-P. This life is fixed only by the response time required for the modulator. However, note that the response time is directly related to the excitation density; the response time becomes slower as it becomes more sensitive, and vice versa.

Carriers may equally well be injected optically or electrically, in the case of a light emitting cavity or an optical modulator. When carriers are injected optically, they are injected into the structure using a laser pump. When they are injected electrically, one of the mirrors is N doped and the other is P doped, and the diode then formed is polarized directly to inject the carriers.

In another example, two cavities are coupled together. The first cavity emits tunable light and the second, the spacer of which consists solely of an SR-P without an active area, resonates at one or several tunable wavelengths and modulates the light emission from the first cavity. There are two control currents, one for each cavity.

As a variant, the first cavity is a tunable resonance cavity and the second is a simple cavity, without SR-P or an active area that resonates at one or several fixed wavelengths. Emission of light from the first cavity can then be controlled to take place either at the same wavelength as the resonance of the second cavity ("conducting" state), or at another wavelength ("non-conducting" state). In both cases, a simple light modulation system is obtained that can operate at above 1 GHz.

We will now describe more specific examples of the invention.

One very interesting characteristic of the invention is that it may be used with any family of semiconductors. This family is chosen as a function of the target application, the required wavelength and the available manufacturing technique.

The semiconductors used may be III-V or II-VI semiconductors with zinc blende or wurtzite type crystalline structures. Zinc blende type heterostructures may be made on substrates with high crystallographic indexes (n, l, m) where n×l×m≠0, in order to obtain piezoelectric effects. For a wurtzite type heterostructure, it simply has to be formed along the c axis of the crystalline grating of this heterostructure.

For example, it is possible to use:

(i) InGaAs/InGaAsP heterostructures on InP substrates for devices operating at wavelengths used in telecommunications (1.3 $\mu$m and 1.5 $\mu$m), and compatible with the technology used for InP.

(ii) GaInAsn/GaInAs heterostructures on GaAs substrates as an alternative to the previous heterostructures for components operating at between 1.3 $\mu$m and 1.5 $\mu$m.

(iii) InGaAs/GaAlAs heterostructures on GaAs substrates for components operating at between 0.8 $\mu$m and 1 $\mu$m.

(iv) InGaN/AlGaN wurtzite type heterostructures on sapphire substrates for components operating at between 0.3 and 0.5 $\mu$m.

(v) CdHgTe/CdTe heterostructures on CdZnTe substrates for components operating at wavelengths exceeding 1.5 $\mu$m.

In the invention, it is also possible to make use of spontaneous polarization effects, for example that occur in InGaN/GaN base systems on sapphire in order to create electric fields in the layers of SR-P structure.

The direction and amplitude of the electric fields may be controlled for example by changing the compositions of the alloys from which the layers are formed (see document [6]).

We will now consider an example heterostructure on an InP substrate operating at a wavelength of 1.55 $\mu$m.

This is an example used to obtain a VCSEL tunable in wavelength. The resonant cavity of this VCSEL is epitaxied coherently on a substrate made of InP (111). The VCSEL mirrors are distributed Bragg reflectors, for example made of GaAS/GaAlAs, and are deposited on each side of the cavity by wafer fusion. Document [14] provides information about this subject.

The SR-P of the VCSEL is composed of two layers with the same prohibited band and mesh parameters such that the piezoelectric fields of each of these layers have the same intensity but opposite directions. If it is assumed that the piezoelectric coefficient is constant for alloys making up the SR-P layers, these fields may be obtained by strains with the same absolute value but opposite signs.

Assuming that the state of strain is defined with respect to the mesh parameter of the InP substrate, the following table shows an example for which this condition is satisfied.

| Layer | Prohibited band width (meV) | Mesh parameter (nm) | Strain (%) |
| --- | --- | --- | --- |
| $(Ga_{0.17}In_{0.83})(As_{0.55}P_{0.45})$ | 841 | 0.5906 | −0.63 |
| $(Ga_{0.55}In_{0.44})As$ | 841 | 0.5832 | +0.63 |

For this example, prohibited bands (at 300K) and mesh parameters of binary materials were defined with reference to document [15]. A linear interpolation was used between the parameters of binary materials taking account of bowing: $b_{GaAsP}$=0.5 eV (see document [16]), $b_{GaInAs}$=0.475 eV (see document [17]), $b_{GaInP}$=0.5 eV (see document [18]), $b_{InAsP}$= 0.1 eV (see document [19]). The mesh parameter of the InP substrate is equal to 0.58687 nm.

In this case, the strains on a period of the SR-P are perfectly compensated. This is useful for making fairly thick resonant cavities. The critical thickness for each layer is greater than 70 nm (see document [20]) and the piezoelectric field for strains of this magnitude is of the order of a hundred kilovolts per centimeter. The thickness of each layer may be 10 nm for about a hundred periods.

The active area may be composed of unstrained quantum wells made of $Ga_{0.47}In_{0.53}As$ with a thickness of 6 nm and a prohibited band width leading to light emission with a wavelength of about 1.55 $\mu$m.

The SR-P and the active area may be included in a micro-cavity to make the VCSEL, but may also be included in an edge emission laser diode.

We will now consider an example of a heterostructure made from materials II-VI.

An SR-P was made with II-VI materials of this type, and the photoluminescence range of this type of SR-P was studied in order to demonstrate the offset of the prohibited band as a function of the injection of charge carriers.

The SR-P is epitaxied on a $Cd_{0.88}Zn_{0.12}Te$ substrate 211 and comprises a pattern composed of a layer of $Cd_{0.91}Mg_{0.09}Te$ and a layer $Cd_{0.88}Zn_{0.22}Te$, each 10 nm thick, this pattern being repeated about a hundred times. The field induced by the strains is of the order of a hundred kV/cm in this example.

The following reference documents are mentioned in this description:

[1] J. Talghader and J. S Smith, Appl. Phys. Lett. 66, 335 (1995)

[2] M. Larson and J. S Harris Jr, Appl. Phys. Lett. 68, 891 (1996)

[3] N. K Dutta, W. S. Hobson, J. Lopata and G. Zydzik, Appl. Phys. Lett. 70, 1219 (1997)

[4] F. Faure, D. Le Guen, J. C. Simon and B. Landousies, Electron. Lett. 22, 795 (1986)

[5] S. Murata and I. Mito, Optical and Quantum Electronics 22, (1990), pages 1 to 15

[6] F. Bernardini, V. Fiorentini, D. Vanderbilt, Phys. Rev. B56 (1997), R1024

[7] D. A. B. Miller et al., Phys. Rev. B32, 1043 (1985)

[8] R. H. Yan, R. J. Simes and L. A. Coldren, IEEE J. Quantum Electron. 25, 2272 (1989)

[9] D. L. Smith and C. Mailhiot, Rev. Mod. Phys. 62, 173 (1990)

[10] E. Anastassakis, Phys. Rev. B 46, 4744 (1992)

[11] G. H. Döhler, Opt. and Quant. Electr. 22, S121 (1990)

[12] P. Michler, T. Lilienkamp, W. Ebeling, J. Gutoswtki, M. Behringer, M. Fehrer and D. Hommel, Appl. Phys. Lett. 72, 3320 (1998)

[13] Guido Mula, N. T. Pelekanos, P. Gentile, N. Magnea and J. L. Pautrat, Appl. Phys. Lett. 70, 856 (1997)

[14] D. I. Babic, K. Streubel, R. P. Mirin, N. M. Margarlit, J. E. Bowers, E. L. Hu, D. E. Mars, L. Yang and K. Carey, IEEE Photonics Technol. Lett. 7, 1225 (1995)

[15] Jacques I. Pankove, Optical Processes in Semiconductors, Dover Publications Inc., New York 1971.

[16] J. Appl. Phys. 84, 3696 (1998)

[17] J. Appl. Phys. 69, 827 (1991)

[18] Phys. Rev. B 6, 1301 (1972)

[19] J. Appl. Phys. 80 846 (1996)
[20] K. W. Gossen, E. A. Caridi, T. Y. Chang, J. B. Stark, D. A. B. Miller and R. A. Morgan, Appl. Phys. Lett. 56, 715 (1990).

What is claimed is:

1. Optical semiconductor device having a resonant cavity tunable in wavelength and delimited by two mirrors comprising:
    at least one super-lattice placed in the resonant cavity and formed from piezoelectric semiconducting layers; and
    first means of injecting charge carriers into the super-lattice, so that the optical properties of the super-lattice can be modified when the charge carriers are injected into said super-lattice, thus creating an offset in the wavelength of the cavity resonance modes.

2. Device according to claim 1, further comprising an active area placed in the resonant cavity and designed to inject the charge carriers into the active area so that the active area emits radiation.

3. Device according to claim 2, wherein the first charge carrier injection means are also designed to inject the charge carriers into the active area so that the active area emits said radiation.

4. Device according to claim 2, further comprising second charge carrier injection means designed to inject the charge carriers into the active area so that the active area emits said radiation.

5. Device according to claim 2, said device being capable of emitting laser radiation, the mirrors being perpendicular to the growth axis of the semiconducting layers included in the device such that vertical emission of the laser radiation is obtained.

6. Device according to claim 2, said device being capable of emitting laser radiation, the mirrors being parallel to the growth axis of the semiconducting layers included in the device such that edge emission of the laser radiation is obtained.

7. Device according to claim 2, said device being capable of emitting incoherent radiation, the mirrors being parallel to the growth axis of the semiconducting layers of the device such that edge emission of the incoherent radiation is obtained.

8. Device according to claim 1, in which the first means of injecting charge carriers are electrical.

9. Device according to claim 1, in which the first means of injecting charge carriers are optical.

10. Device according to claim 1, in which the piezoelectric semiconducting layers have zinc blende type crystalline structures.

11. Device according to claim 1, in which the piezoelectric semiconducting layers have wurtzite type crystalline structures.

12. An optical semiconductor device having a resonant cavity tunable in wavelength and delimited by two mirrors comprising:
    at least one super-lattice placed in the resonant cavity and formed from piezoelectric semiconducting layers;
    first means of injecting charge carriers into the super-lattice, so that the optical properties of the super-lattice can be modified when the charge carriers are injected into said super-lattice, thus creating an offset in the wavelength of the cavity resonance modes; and
    an active area placed in the resonant cavity and designed to inject the charge carriers into the active area so that the active area emits radiation, said device being capable of emitting incoherent radiation, the mirrors being perpendicular to the growth axis of the semiconducting layers included in the device in order to obtain vertical emission of said incoherent radiation.

13. A light intensity modulation device comprising:
    an optical semiconductor device comprising:
        a first resonant cavity tunable in wavelength;
        first and second mirrors delimiting the first resonant cavity;
        at least one super-lattice placed in the first resonant cavity and formed from piezoelectric semiconducting layers;
        first means of injecting charge carriers into the super-lattice, so that the optical properties of said super-lattice can be modified when the charge carriers are injected into said super-lattice, thus creating an offset in the wavelength of the cavity resonance modes; and
        an active area disposed in the cavity and designed to emit radiation during the injection of charge carriers thereinto; and
    a second resonant cavity optically coupled to the optical semiconducting device and having a second super-lattice formed from piezoelectric semiconducting layers, the second resonant cavity capable of resonating at one or more tunable wavelengths.

14. A light intensity modulation device comprising:
    an optical semiconductor device comprising:
        a first resonant cavity tunable in wavelength;
        first and second mirrors delimiting the first resonant cavity;
        at least one super-lattice placed in the first resonant cavity and formed from piezoelectric semiconducting layers;
        first means of injecting charge carriers into the super-lattice, so that the optical properties of said super-lattice can be modified when the charge carriers are injected into said super-lattice, thus creating an offset in the wavelength of the cavity resonance modes; and
        an active area disposed in the cavity and designed to emit radiation during the injection of charge carriers thereinto; and
    a second resonant cavity optically coupled to the optical semiconducting device and capable of resonating at one or more fixed wavelengths.

* * * * *